(12) United States Patent
Chou et al.

(10) Patent No.: US 6,417,553 B1
(45) Date of Patent: Jul. 9, 2002

(54) SEMICONDUCTOR WAFER WITH SENSORS FOR DETECTING RADIATION ON THE SEMICONDUCTOR WAFER

(75) Inventors: Kuo-Yu Chou, Hsin-Chu Hsien; Chien-Shan Chiang, Tai-Chung Hsien; Lo-Chun Ho, Hsin-Chu; Chih-Hsueh Hsu, Chi-Lung, all of (TW)

(73) Assignee: AMIC Technology (Taiwan) Inc., Hsin-Chu Hsien (TW)

( * ) Notice: Subject to any disclaimer, the term of this patent is extended or adjusted under 35 U.S.C. 154(b) by 0 days.

(21) Appl. No.: 09/682,482

(22) Filed: Sep. 7, 2001

(30) Foreign Application Priority Data

Mar. 16, 2001 (TW) ........................................ 90106277 A

(51) Int. Cl.[7] .............................................. H01L 31/04
(52) U.S. Cl. ........................................ 257/462; 257/440
(58) Field of Search .................................. 257/440, 462

(56) References Cited

U.S. PATENT DOCUMENTS

| 5,412,243 A | * | 5/1995 | Morishita | 257/461 |
| 5,945,722 A | * | 8/1999 | Tsuei et al. | 257/232 |
| 6,114,740 A | * | 9/2000 | Takimoto et al. | 257/443 |

FOREIGN PATENT DOCUMENTS

| JP | 06216385 A | * | 8/1994 | ......... H01L/29/784 |
| JP | 2000150662 A | * | 5/2000 | ....... H01L/21/8234 |

* cited by examiner

*Primary Examiner*—Allan R. Wilson
(74) *Attorney, Agent, or Firm*—Winston Hsu

(57) ABSTRACT

A semiconductor wafer includes a plurality of sensors. Each of the sensors has a field oxide transistor, and a detecting circuit electrically connected to the field oxide transistor for detecting if the field oxide transistor is switched on or off and generating corresponding detecting signals. The field oxide of a different field oxide transistor has a different thickness. Each field oxide transistor is coupled to a corresponding detecting circuit for detecting radiation impinging on the semiconductor wafer.

6 Claims, 3 Drawing Sheets

SEMICONDUCTOR WAFER WITH SENSORS FOR DETECTING RADIATION ON THE SEMICONDUCTOR WAFER

BACKGROUND OF INVENTION

1. Field of the Invention

The invention relates to a semiconductor wafer that can detect radiation, and more particularly, to a semiconductor wafer that uses a conducting state of a channel of a field oxide to measure radiance.

2. Description of the Prior Art

Due to the extensive use of semiconductor devices, semiconductor wafers are more often subjected to environments that have a large amount of radiation. This radiation can cause a semiconductor device to malfunction. Please refer to FIG. 1. FIG. 1 is a structural diagram of a prior art semiconductor wafer 10. The semiconductor wafer 10 has two N-type metal-oxide-semiconductor (NMOS) transistors 12A and 12B on a P-type substrate. Each NMOS transistor has a gate 16A or 16B, a source 18A or 18B, a drain 20A or 20B, and a gate oxide 22A or 22B. In the highly compact modern circuit layouts, distances between transistors are extremely small, and are isolated by field oxides, like field oxide 28 in the semiconductor wafer 10, to prevent mutual electrical interference. Conductive layer 26 on the field oxide 28 provides a link to each transistor. The conductive layer 26 is typically a metallic link in the semiconductor wafer 10. In addition, a channel stop 15 is below the field oxide 28.

When a semiconductor wafer 10 is subject to radiation, the energy of the radiation will create electron-hole pairs in the oxide layer in semiconductor wafer 10. Holes are more likely to be retained in the oxide layer because hole mobility is slower in an oxide layer. In a field oxide layer, the above phenomenon is more evident. Compared to other oxide layers (such as a gate oxide) in a semiconductor wafer, electron-hole pairs are more likely to occur in the field oxide layer, and holes are more likely to accumulate in a field oxide because the volume of a field oxide is larger.

When the conductive layer 26 passes over the field oxide 28, field oxide 28, conductive layer 26 and two electrodes 18A and 20B become, in effect, a field oxide transistor. Field oxide 28 is equivalent to a gate oxide capacitor. Charge carried by holes accumulated in the field oxide 28 reduces the threshold voltage of the equivalent field oxide transistor. It is well known that changing the amplitude of the threshold voltage of a metal-oxide-semiconductor is proportional to charge of the gate oxide capacitance, and inversely proportional to the capacitance of a gate oxide capacitor. In a metal-oxide-semiconductor transistor, when the gate oxide capacitance is very small, even very little net charge on the gate oxide capacitor will cause dramatic change of the threshold voltage. This change of threshold voltage in the above equivalent field oxide transistor is particularly evident. Because holes easily accumulate in the field oxide, and the field oxide is very thick, the equivalent gate capacitance of the field oxide is relatively small, and the threshold voltage caused by charge is thus affected more. If too much charge accumulates on the field oxide 28 because of radiation, the threshold voltage of the field oxide transistor is, in effect, reduced. If there is electric activity in the conductive layer 26, a channel will form below the field oxide 28 and activate the equivalent field oxide transistor. An improper electric connection between the electrode 18A and the electrode 20B on two sides of the field oxide 28 is formed. Then, the functionality of the field oxide 28 to isolate transistor 12A and transistor 12B is damaged and causes the semiconductor wafer 10 to malfunction.

In the prior art, the semiconductor wafer 10 has no advance warning that the semiconductor wafer 10 is being influenced by radiation. When negative affects induced by radiation accumulate to cause a prior art semiconductor wafer 10 to malfunction, normal operations of a microprocessor system based on the semiconductor wafer 10 is severely and adversely influenced.

SUMMARY OF INVENTION

It is therefore a primary objective of the present invention to provide a semiconductor wafer that can detect radiation and provide a warning signal when the semiconductor wafer is subjected to radiation-induced damage in the early stages of exposure.

Briefly, in a preferred embodiment, the present invention provides a semiconductor wafer having at least one sensor comprising. The sensor includes a field oxide transistor, and a detecting circuit electrically connected to the field oxide transistor for detecting if the field oxide transistor is switched on or off and generating corresponding detecting signals.

It is an advantage of the present invention that the semiconductor wafer according to the present invention can detect radiation and provide a corresponding warning. Malfunctions of a semiconductor wafer can thus be prevented.

These and other objects and the advantages of the present invention will no doubt become obvious to those of ordinary skill in the art after having read the following detailed description of the preferred embodiment that is illustrated in the various figures and drawings.

DETAILED DESCRIPTION

Figure 1:
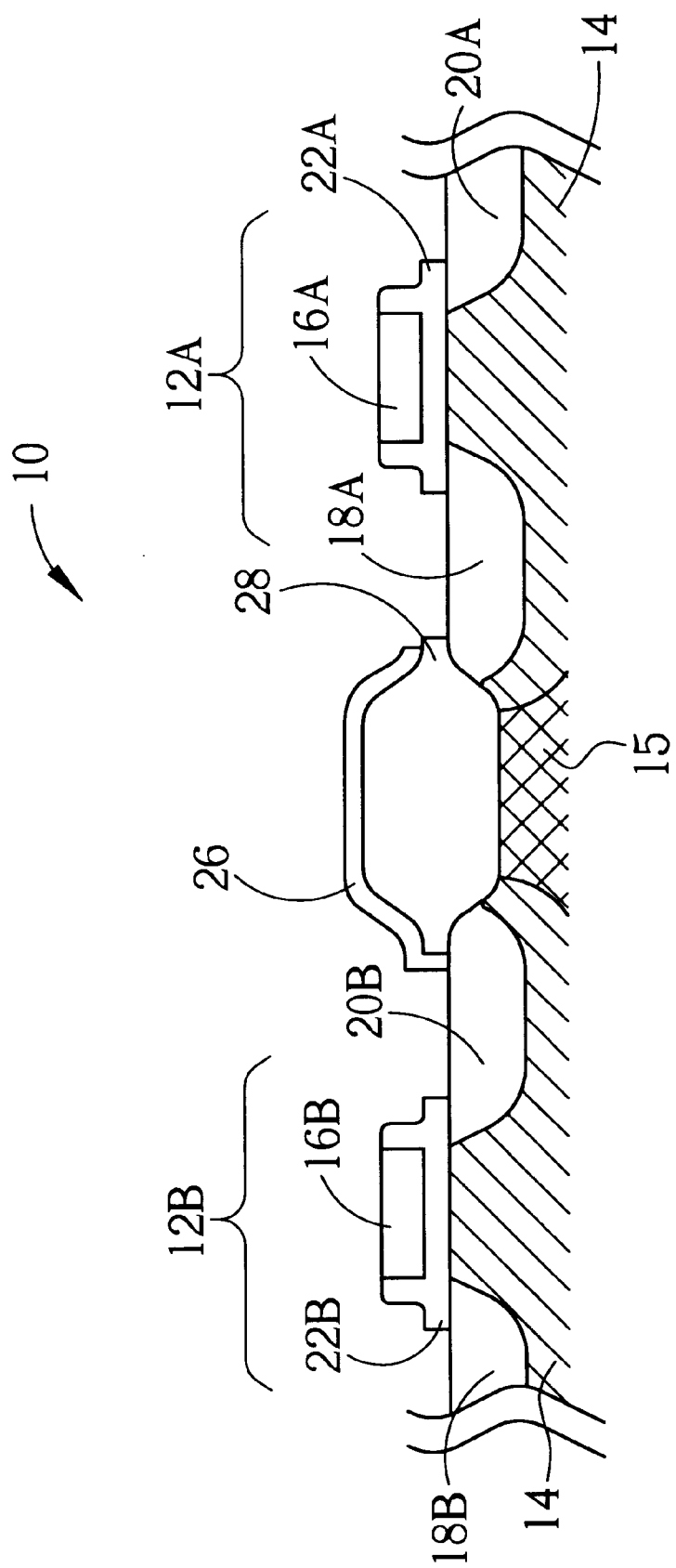
FIG. 1 is a schematic diagram of a structure of a prior art semiconductor wafer.
Figure 2:
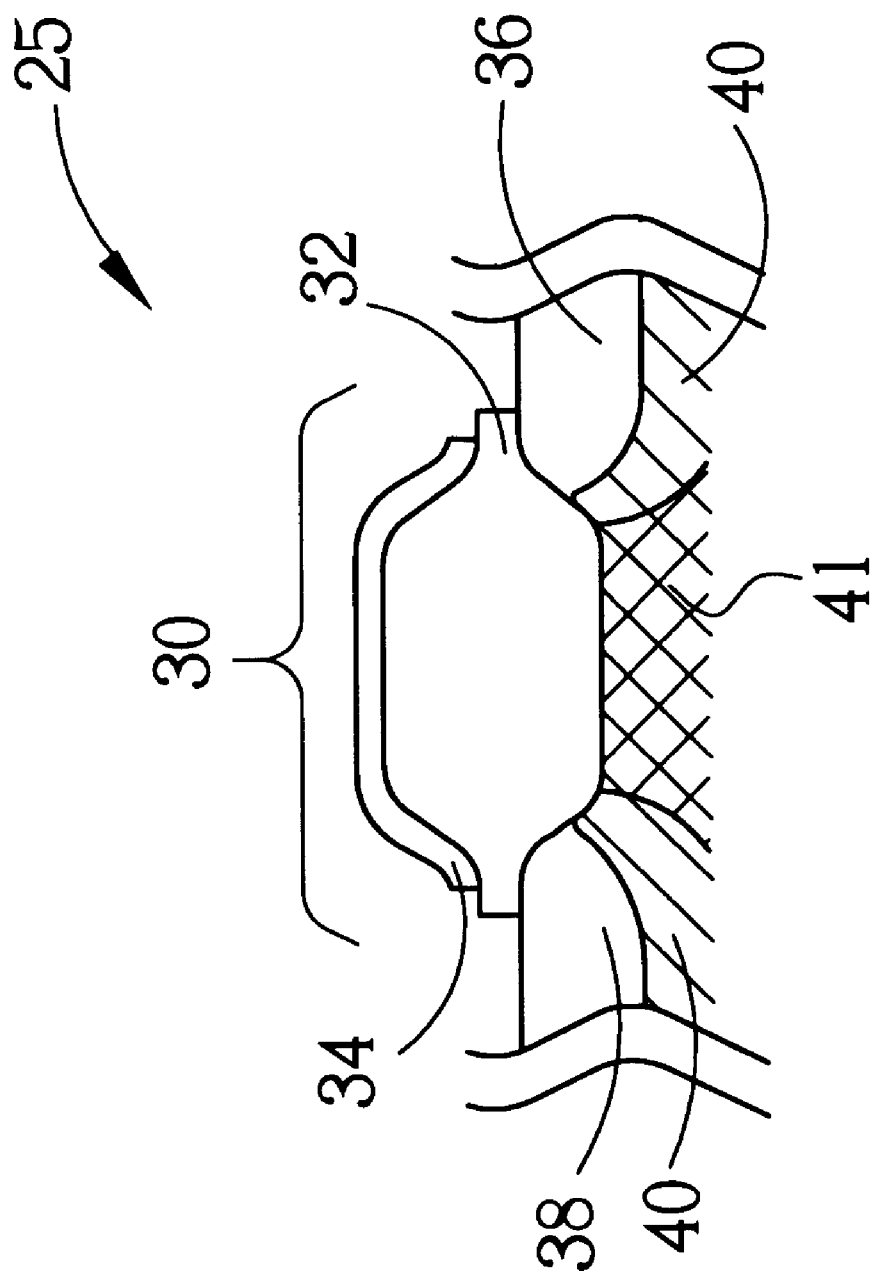
FIG. 2 is a schematic diagram of a structure of a semiconductor wafer of the present invention.

In addition to common transistors and circuits for performing various functions, a semiconductor wafer of the present invention has a detecting transistor for detecting radiation in order to provide a warning of the radiation. Please refer to FIG. 2. FIG. 2 is a schematic diagram of a structure of a detecting transistor 30 in a semiconductor wafer 25 of the present invention. The semiconductor wafer 25 of the present invention has a p-type base 40 and a field oxide 32 for isolating common transistors. The function and set-up of the field oxide 32 is the same as the field oxide 28 in the prior art semiconductor wafer 10. The detecting transistor 30 of the present invention also uses a part of the field oxide 32 of the semiconductor wafer 25 and forms two conductive contacts, drain 36 and source 38 respectively, on both sides of the field oxide 32. In addition, a conductive gate 34 is set on the field oxide 32. In the detecting transistor 30, arrangement of the gate 34, the drain 36 and the source 38 with the field oxide 32 in between is equivalent to a field transistor. The biggest difference between the detecting transistor 30 and other ordinary metal-oxide-semiconductor transistors is a bulky and thick field oxide 32 isolating the gate 30 and the channel in the detecting transistor 30. Oxide layers in other ordinary metal-oxide-semiconductor transistors are a thinner gate oxide. The two conductive contacts in the detecting transistor 30, the drain 36 and the source 38, are respectively formed by two n-typed doped regions on the p-type substrate 40 and of a conductive material. A channel stop 41 is below the field oxide 32.

As described above, a thicker field oxide is easily affected by radiation and the corresponding accumulation of charge. For the same reason, when the detecting transistor 30 of the present invention is subjected to radiation, electron-hole pairs are also produced, and holes accumulate in the field oxide 32 of the detecting transistor 30 because of lower mobility. Because the field oxide 32 in the detecting transistor 30 is equivalent to a gate capacitor, charge produced by hole accumulation will lower the threshold voltage of the detecting transistor 30. As a well-known physical phenomenon, change of the threshold voltage of the detecting transistor 30 will change a conducting condition between the drain 36 and the source 38. So, measurement of the conducting condition between the drain 36 and the source 38 can reveal the degree of exposure of the detecting transistor 30 to radiation, and thus provide a measurement of radiation exposure of the semiconductor wafer 25 of the present invention.

To warn of radiation-induced damage, the field oxide 32 of the detecting transistor 30 of the present invention can be thickened to a thickness that is thicker than any other isolating field oxide in semiconductor wafer 25. The thicker the field oxide is, the less the capacitance of the equivalent gate capacitor is. And change of the threshold voltage influenced by hole charge is greater. In other words, the conducting condition between two conductive contacts (i.e., the drain 36 and the source 38) adjacent to a thicker field oxide (i.e., the field oxide 32) is more susceptible to charge accumulation and is thus more sensitive to exposure to radiation. The field oxide 32 in the detecting transistor 30 should thus be thickened to a thickness that is thicker than any other isolating field oxide in semiconductor wafer 25 so that current conduction between the two conductive contacts (drain 36 and source 38) in the detecting transistor 30 is changed by radiation before other field oxides isolating ordinary transistors are influenced. In this arrangement, current conduction change between the two conductive contacts (drain 36 and source 38) in the detecting transistor 30 means that the semiconductor wafer 25 has received a certain dosage of radiation. If the semiconductor wafer 25 continues to be subjected to radiation exposure, the normal functioning of the semiconductor wafer 25 will be adversely influenced. So, the influence of radiation on the operations of the semiconductor wafer 25 can be forewarned by the detecting transistor 30.

Figure 3:
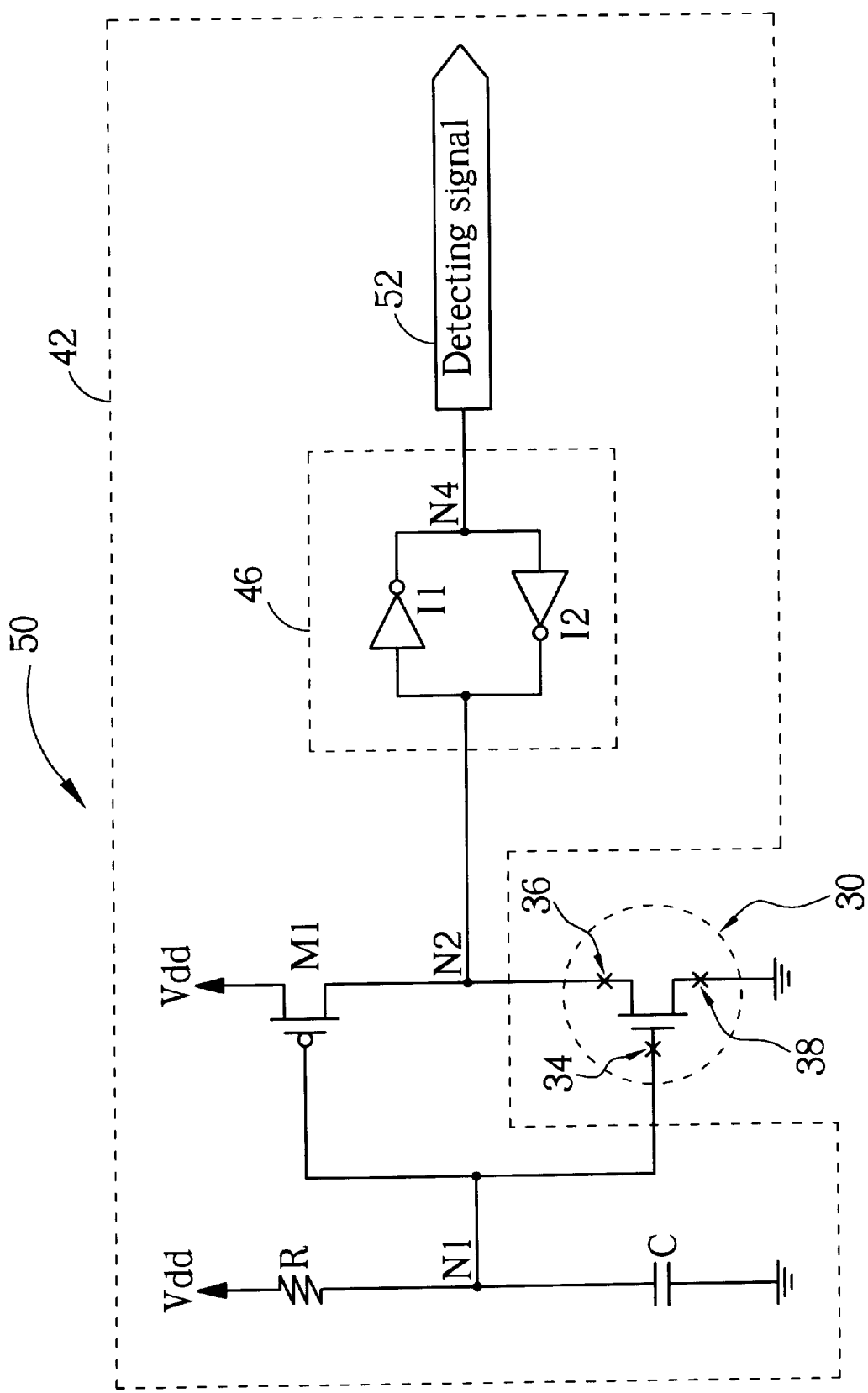
FIG. 3 is a schematic diagram of a sensor embodiment of a semiconductor wafer of the present invention.

There are many possible embodiments to measure current conduction between the two conductive contacts in the detecting transistor 30. Please refer to FIG. 3. FIG. 3 is a circuit schematic diagram of an embodiment of a sensor 50 according to the present invention. The sensor 50 uses a detecting circuit 42 to measure current conduction between two conductive contacts in the detecting transistor 30, and transmits a detecting signal of radiation-induced effects of the detecting transistor 30. The sensor 50 is disposed on the semiconductor wafer 25 of the present invention, and has a detecting circuit 42 for detecting current conduction between two conductive contacts (drain 36 and source 38) in the detecting transistor 30. Please note that, for convenience of the present disclosure of the function and structure of the sensor 50, the detecting transistor 30 in FIG.2 is shown as a circuit symbol. As described above, the detecting transistor 30 can be viewed as an n-type metal-oxide-semiconductor transistor (i.e. a field transistor). In the sensor 50, two conductive contacts in the detecting transistor 30, drain 36 and source 38, are respectively connected to node N2 and ground of the detecting circuit 42. Gate 34 of the detecting transistor 30 is connected to node N1 of the detecting circuit 42. In the detecting circuit 42, there is a p-type metal-oxide-semiconductor transistor M1. A source, a drain and a gate of the p-type metal-oxide-semiconductor transistor M1 are respectively connected to a direct current Vdd, a node N2 and a node N1. Connected to N1 are a resistor R and a capacitor C. Two inverters I1 and I2 of a latch 46 are connected to the node N2. Finally, detecting signal 52 of the sensor 50 is output from a node N4. Please note that all metal-oxide-semiconductor transistors (including transistor Ml) in the detecting circuit 42 are common metal-oxide-semiconductor transistors. The field oxide in gates, drains and sources of these metal-oxide-semiconductor transistors is a gate oxide. Only in the detecting transistor 30 is the thickened field oxide used between gate 34, drain 36 and source 38.

Operation of the sensor 50 is described below. The direct current Vdd charges the capacitor C through the resistor R and makes a steady-state voltage of the node N1 that is close to a voltage of the direct current Vdd. When the sensor 50 is not subject to radiation (or the radiation dosage is low), the field oxide in the detecting transistor 30 normally isolates drain 36 and source 38. That is, the threshold voltage of the detecting transistor 30 is very large. Even connecting the gate 34 and the node N1 will not turn on the detecting transistor 30. At this time, the detecting signal 52 is at a low level. Once the detecting transistor 30 is subject to radiation and accumulates holes in the oxide, the threshold voltage of the detecting transistor 30 declines. The threshold voltage of the detecting transistor 30 declines down to a certain degree, and then the drain 36 and the source 38 will be connected, and the voltage of N2 will decline, and the detecting signal 52 output from the latch circuit 46 will become high. In other words, if the detecting signal 52 of the sensor 50 goes high from a low state,then the detecting signal 52 should be inferred as a warning that radiation-induced effects are possible.

In fact, a detecting circuit for detecting current conduction between the two conductive contacts of the detecting transistor 30 may have many other embodiments, such as a comparator comparing a reference current and a current between the two conductive contacts of the detecting transistor 30, and a comparison result being used as a detecting signal for warning. In addition, several sensors of differing sensitivity to radiation can be disposed on the semiconductor wafer of the present invention to quantize radiation warning effects. If the radiation dosage causes one sensor S1 to produce a warning but not the other less sensitive sensor S2, then it can be inferred that the radiation dosage is beyond a warning level of S1 but below a warning level of S2. Changing the warning levels of sensors can be performed by setting the respective field oxides to different thicknesses. As previously discussed, the thickness of the field oxide 32 of the detecting transistor 30 influences the capacitance of the equivalent gate capacitor. When charge accumulates on the field oxide, threshold voltage lowering is different because of different equivalent capacitances, and influence upon the threshold voltage of the detecting transistor is different. In other words, changing of the thickness of the field oxide 32 of the detecting transistor 30 changes the corresponding sensitivity (i.e., the warning level) of the sensor 50. In addition, connecting gate 34 of the detecting transistor 30 to different voltages also influences the warning level of the detecting transistor 30. Doping different concentrations of the channel stop below the field oxide 32 of the detecting transistor 30 can also change warning levels of the detecting transistor 30.

Compared with the prior art semiconductor wafer, which is unable to detect and warn of radiation dosages, a semiconductor chip of the present invention has the detecting transistor 30. The field oxide 32 of the detecting transistor 30 will change the conduction of the detecting transistor (i.e. the field transistor) under exposure to radiation. And through detecting conductance of the detecting transistor 30 by the detecting circuit 42 of the sensor 50, a detecting signal is transmitted to warn of excessive radiation levels that may lead to adverse circuit performance. The present invention is particularly suitable for integration into flash memory, or other electronic circuits that are vulnerable to radiation, and thus enables prior warning of radiation dosages that are harmful to normal operation. If properly designed, the semiconductor wafer of the present invention can also quantize radiance dosages.

Those skilled in the art will readily observe that numerous modifications and alterations of the radiation sensor may be made while retaining the teachings of the invention. Accordingly, the above disclosure should be construed as limited only by the metes and bounds of the appended claims.

What is claimed is:

1. A semiconductor wafer comprising:
    at least one sensor comprising:
        a first field oxide transistor comprising a field oxide that is thicker than field oxides of other field oxide transistors on the semiconductor wafer; and
        a detecting circuit electrically connected to the first field oxide transistor for detecting if the first field oxide transistor is switched on or off in response to radiation, and generating a corresponding detecting signal.

2. The semiconductor wafer of claim 1 wherein the sensor further comprises a second field oxide transistor, the field oxide of the first field oxide transistor having a different thickness than a field oxide of the second field oxide transistor so that the first field oxide transistor has a differing sensitivity to radiation than the second field oxide transistor, the first and second field oxide transistors coupled to a corresponding detecting circuit for detecting radiation exposure of the semiconductor wafer.

3. The semiconductor wafer of claim 1 further comprising a p-type substrate.

4. A semiconductor wafer comprising:
    a substrate;
    a field oxide formed above the substrate that is thicker than other field oxides on the semiconductor wafer; and
    a sensor comprising:
        two electric nodes formed at two ends of the field oxide;
        a detecting circuit electrically connected to the two electric nodes for detecting if the two electric nodes are electrically connected and generating corresponding detecting signals; and
        a gate layer formed above the field oxide and electrically connected to the detecting circuit.

5. The semiconductor wafer of claim 4 further comprising a plurality of field oxides disposed below different gate layers, each of the field oxides having a different thickness and coupled to a corresponding sensor for detecting radiation on the semiconductor wafer.

6. The semiconductor wafer of claim 4 wherein the substrate is a p-type substrate.

* * * * *